United States Patent
Shkap

(10) Patent No.: US 6,414,547 B1
(45) Date of Patent: Jul. 2, 2002

(54) VARIABLE GAIN RF AMPLIFIER

(75) Inventor: Daniel Shkap, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,592

(22) Filed: Sep. 29, 2000

(51) Int. Cl.⁷ .............................................. H03F 3/45
(52) U.S. Cl. ...................... 330/254; 330/256; 330/300
(58) Field of Search ................................ 330/252, 254, 330/256, 300

(56) References Cited

U.S. PATENT DOCUMENTS

| | | | | |
|---|---|---|---|---|
| 3,534,278 | A | 10/1970 | Bodtmann | 330/21 |
| 3,634,775 | A | 1/1972 | Ulmer | 330/29 |
| 4,403,255 | A | 9/1983 | Schiff | 358/186 |
| 4,502,021 | A | 2/1985 | Hill et al. | 330/279 |
| 4,775,988 | A | 10/1988 | Chevillat et al. | 375/98 |
| 4,829,593 | A | 5/1989 | Hara | 455/234 |
| 4,910,467 | A | 3/1990 | Leitch | 329/306 |
| 5,179,353 | A | 1/1993 | Miyake | 330/129 |
| 5,187,809 | A | 2/1993 | Rich et al. | 455/33.1 |
| 5,196,806 | A | 3/1993 | Ichihara | 330/137 |
| 5,276,921 | A | 1/1994 | Kosugi | 455/119 |
| 5,303,394 | A | 4/1994 | Hrncirik | 455/84 |
| 5,304,947 | A | 4/1994 | Carlsson | 330/279 |
| 5,304,948 | A | 4/1994 | Mucke | 330/289 |
| 5,323,329 | A | 6/1994 | Keane | 364/492 |
| 5,339,454 | A | 8/1994 | Kuo et al. | 455/247.1 |
| 5,361,395 | A | 11/1994 | Yamamoto | 455/33.2 |
| 5,384,501 | A | * 1/1995 | Koyama et al. | 330/300 X |
| 5,572,166 | A | 11/1996 | Gilbert | 330/254 |
| 5,889,432 | A | * 3/1999 | Ho | 330/254 |
| 6,091,275 | A | * 7/2000 | Behzad | 330/254 X |

* cited by examiner

*Primary Examiner*—Steven J. Mottola
(74) *Attorney, Agent, or Firm*—Connolly Bove Lodge & Hutz LLP.

(57) ABSTRACT

The present invention is directed to a variable gain amplifier that may be used in RF telecommunication applications to obtain amplification of analog signals. It is also directed toward minimizing the effect that temperature variations have on the gain of the amplifier. A variable gain RF amplifier, according to this invention, has a differential amplifier and a gain control circuit. The gain control circuit has multiple transistors configured to affect a linear, variable resistor and to substantially distribute a uniform voltage potential across each transistor of the effective variable resistor.

10 Claims, 2 Drawing Sheets

VARIABLE GAIN RF AMPLIFIER

FIELD OF THE INVENTION

The present invention is directed to a variable gain amplifier that may be used in RF communication applications to obtain variable amplification of analog signals while maintaining low distortion. Specifically, a variable gain RF amplifier is described having means to control the amount by which the gain changes with respect to the control voltage, while maintaining a high linearity and gain insensitivity to temperature variations.

BACKGROUND OF THE INVENTION

Differential amplifiers providing a linear gain for a range of input signals are known in the prior art. They are often used to compensate for gain variations due to temperature and process that occur in different sections of a transceiver chain such as in mixers, filters, etc. However, prior art differential amplifiers designs do not adequately provide a means for varying the gain in response to an external signal such that the gain varies linearly, in decibels, with the external signal over a range of RF frequencies. Most prior art variable gain amplifiers do not have a high degree of linearity between input signal and output signal amplitudes. Furthermore, prior art differential amplifier designs fail to adequately provide a gain that is invariant to changes in temperature and manufacturing process parameters, nor do they control the amount by which the gain varies in response to a control voltage to provide a linear variation (in dB) at RF frequencies.

SUMMARY OF THE INVENTION

The present invention is directed to a variable gain amplifier that may be used in RF telecommunication applications to obtain amplification of differential analog signals. It is also directed toward minimizing the effect that temperature variations have on the gain of the amplifier.

The variable gain RF amplifier, according to this invention, is comprised of a differential amplifier and a gain control circuit. The gain control circuit is provided by multiple transistors configured to affect a linear, variable resistor having a uniform voltage potential across each transistor which varies the feedback of differential amplifier. The variable resistor is connected between the differential amplifier transistors and varies the gain of the differential amplifier by controlling the resistance of the variable resistor. Slope compensation to a gain control signal optimizes the change in resistance with respect to changes in the gain control signal. dr

BRIEF DESCRIPTION OF THE DRAWINGS

The above and other objects, features, and advantages of the present invention will become more apparent from the following detailed description that is to be read in conjunction with the accompanying drawings, in which.

DETAILED DESCRIPTION OF THE INVENTION

Figure 1:
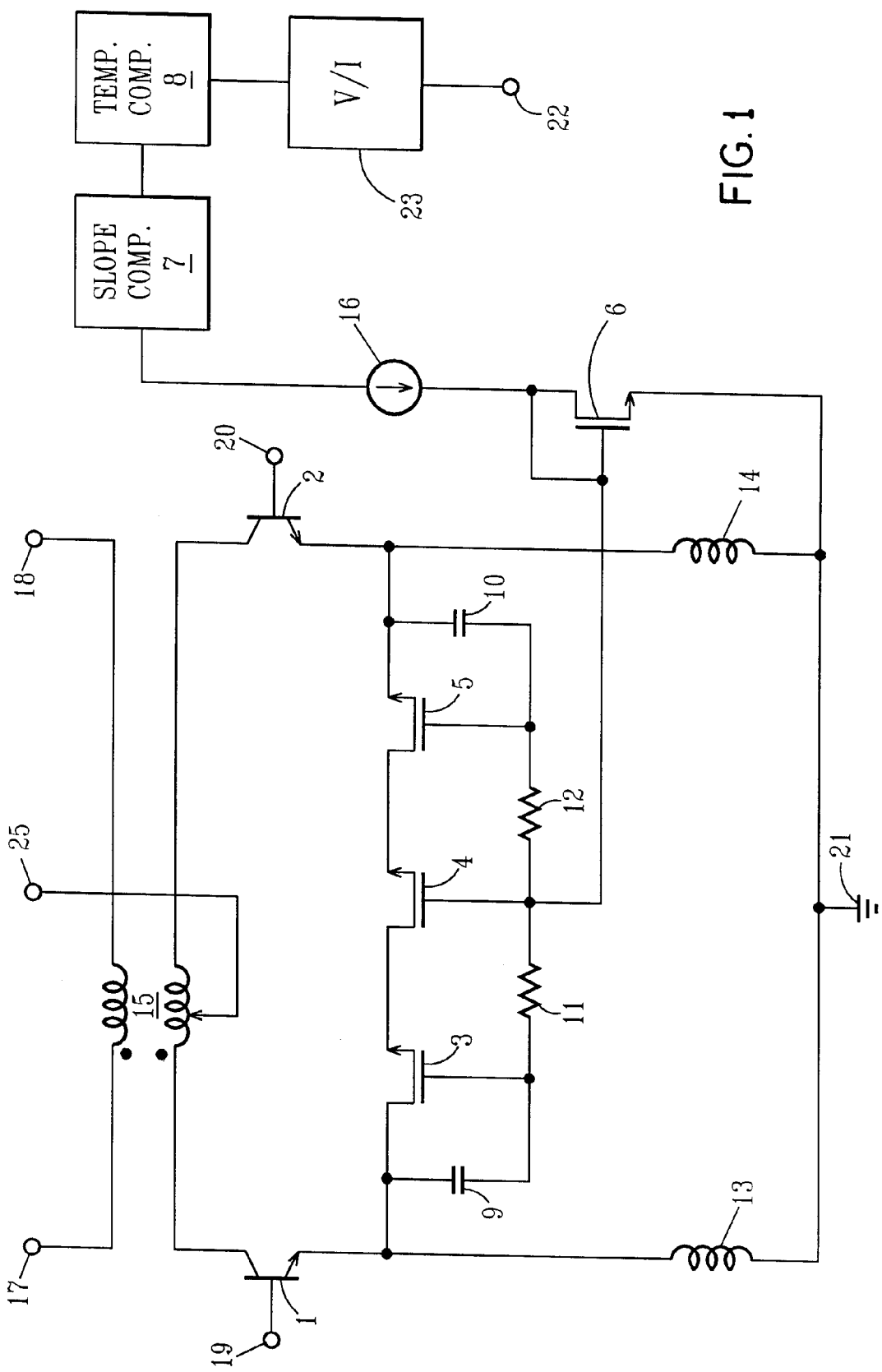
FIG. 1 illustrates a preferred embodiment of the variable gain RF amplifier.

Referring to FIG. 1, a preferred embodiment of the invention is described in relation to a variable gain amplifier operated at a radio frequency (RF). A differential amplifier comprised of the emitter-coupled pair of bipolar transistors 1 and 2 is used as a gain stage to amplify a differential input signal applied to terminals 19 and 20. Terminals 19 and 20 are connected to the base leads of transistors 1 and 2, respectively. The collectors of transistors 1 and 2 are each connected to separate terminals of a winding on transformer 15 and receive a supply voltage from the transformer primary winding through a center tap connected to terminal 25. Output terminals 17 and 18 are each connected to separate terminals of a second winding of transformer 15 and provide the amplified signal to an external circuit. Inductors 13 and 14 present a high impedance path at the RF operating frequency to prevent the AC signal from being shorted to ground. Their value is selected to provide the proper impedance at the RF frequency. They provide a short circuit to ground potential terminal 21 for direct current (DC) such that the gate to source voltage of NMOS transistor 6 is identical to the gate to source voltage of transistors 3, 4 and 5. A bias voltage is applied through conventional biasing means to the base of each of transistors 1, 2.

A variable resistance is applied between the emitters of transistors 1 and 2 by a gain control device, which effectively degenerates the transconductance of the input differential pair, i.e. feedback is applied to reduce the gain. The gain of the RF amplifier is determined by the degenerated transconductance and the load which is a high impedance at the RF frequency. Therefore, changing the amount of degeneration by changing resistance will change the gain of the amplifier.

The gain control device is comprised of a current source 16, N-MOS transistors 3, 4, 5, and 6. Transistors 3, 4, and 5 are connected in series between the emitter leads of transistors 1 and 2. Transistor 3 has its drain connected to the emitter of transistor 1 and its source connected to the drain of transistor 4. Transistor 5 has its drain connected to the source of transistor 4 and its source connected to the emitter of transistor 2. The gate of transistor 4 is connected to the gate and drain leads of transistor 6 and to one lead each of resistors 11 and 12. The other leads of resistors 11 and 12 are connected to the gate leads of transistors 3 and 5, respectively. Capacitor 9 is connected between the emitter of transistor 1 and the gate of transistor 3, to operate as an AC bypass and a DC blocking capacitor between the leads of these two transistors at the operational frequency. Similarly, capacitor 10 is connected between the emitter of transistor 2 and the gate of transistor 5 to perform the same function for these two transistors. Resistors 11 and 12 resistively isolate the AC signals generated on the emitters of transistors 1 and 2 at the operational frequency, since capacitors 9 and 10 have a low impedance to these signals. Transistor 6 has its source connected to the ground potential 21 of the voltage supply and its drain connected to current source 16.

Since MOSFETs operate as linear resistors in their linear mode of operation, transistor 6 converts the current signal provided by current source 16 to a voltage signal. This voltage signal is generated at the drain-source junction of transistor 6 and, because the gate and drain of the transistor are shorted together, forms the gate-source junction voltage. As the current I from current source 16 is varied, the voltage potential $V_{gs,6}$ varies proportionally.

Voltage $V_{gs,6}$ is applied directly to the gate of transistor 4 and to the gates of transistors 3 and 5 through resistors 11 and 12, respectively. No appreciable DC current is conducted by resistors 11 and 12, since capacitors 9 and 10 block DC currents and the gates of MOSFETs 3, 4, and 5 have an extremely high impedance. Consequently, the gate voltages applied to transistors 3, 4, and 5 are substantially equal. Transistors 3, 4, and 5 effectively form a variable resistive component having a resistance that varies in response and proportionally to the voltage potential across the gate-source junctions of each transistor. The series connection of transistors 3, 4, and 5 provides a total resistance substantially equal to three times the resistance of any one transistor from the group.

The total resistance between the emitters of transistors 1 and 2 is the combined resistance of each of the NMOS devices. The resistance of each of these devices is given by Eq. 1:

$$R = \frac{L}{(Vgs - Vth - vds) * Cox\mu * W} \quad \text{Eq. 1}$$

Cox is oxide thickness.
$\mu$ is mobility
Vgs is gate to source voltage
vth is threshold voltage.
vds is the potential from drain source.
L is length.
W is width.

The Vgs of NMOS transistors 3, 4 and 5 is equal to the Vgs on the diode connected NMOS 6. The Vgs on NMOS 6 is set by the current provided by current source 16 which in turn is determined by the control voltage applied to terminal 22. The voltage on NMOS 6 is given by Eq. 2:

$$VGS = \frac{I16 * 2 * L}{\mu * Cox * W} + Vt \quad \text{Eq. 2}$$

Where 116 is the current from current source 16.

The resistance can be also affected by variations in Vds as shown in equation 1. Variations in Vds can arise due to variations in the input signal and as such would cause distortion of the output signal. The MOS transistor 3, 4 and 5 are connected in series so as to divide the drain to source voltage on each device and have a negligible effect on the resistance of each MOS transistor 3, 4 and 5, and, consequently, have a negligible effect on the total degeneration resistance. In addition, variation in the voltage on the emitters of NPN transistors 1, 2, which arise due to the application of the input signal at terminals 19, 20, can modulate the impedance of NMOS transistors 3, 4 and 5 by modulating their gate to source voltage, thereby causing distortion. The inclusion of capacitors 9, 10 provide an AC short reducing modulation that would otherwise result from the input signal. Resistors 11 and 12 are required to isolate the RF signal from the DC control voltage across the gates of NMOS transistors 3, 4, 5 and 6.

The linearity of the variable resistor is further enhanced by capacitors 9 and 10. Without capacitors 9 and 10, modulations of the differential input signal would generate voltage potentials across the drain-gate and gate-source junctions of transistors 3 and 5, respectively. These capacitors act as electrical shorts to signals at the operating frequency to minimize the developed voltage potentials, across the gate to source connection of NMOS transistors 3, 4, and 5 thereby preventing the differential input signal from varying the resistance of the effective resistor and the gain of the differential amplifier. Resistors 11 and 12 isolate the emitters of transistors 1 and 2 at the operational frequency.

A minimization of the RF amplifier's gain variation, resulting from temperature and manufacturing variations, is achieved because transistors 3–6 are manufactured simultaneously on an integrated circuit to have identical electrical and temperature characteristics. Also, the voltage potential across the gate-source junction of transistor 6 is nearly identical to the gate-source junction potentials across transistor 3, 4, and 5, since inductors 13 and 14 act as shorts to ground for DC voltages. Therefore, as the current from current source 16 regulates the voltage developed across the gate-source junction of diode-connected transistor 6, it similarly regulates the voltages developed across the gate-source junctions of transistors 3, 4, and 5.

A slope compensation circuit 7 is used to regulate the current flowing to transistor 6, through current source 16. By varying the current flow to transistor 6, the slope compensation circuit varies the differential amplifier gain. This circuit is designed by means known in the art to vary the amplifier gain according to a specific relationship with the gain control signal applied to terminal 22. The signal voltage applied to terminal 22 is connected to a current in V/I converter 23. One possible relationship is to vary the amplifier gain linearly in decibels with respect to the gain control signal applied to terminal 22.

Additional minimization of gain variation with temperature is achieved by using a temperature compensation circuit 8. The temperature profile of this block is designed to counter the resistance variation, of the linear resistor, with temperature. Multiple solutions for implementing the temperature compensation circuit are known to those skilled in the art.

Figure 2:
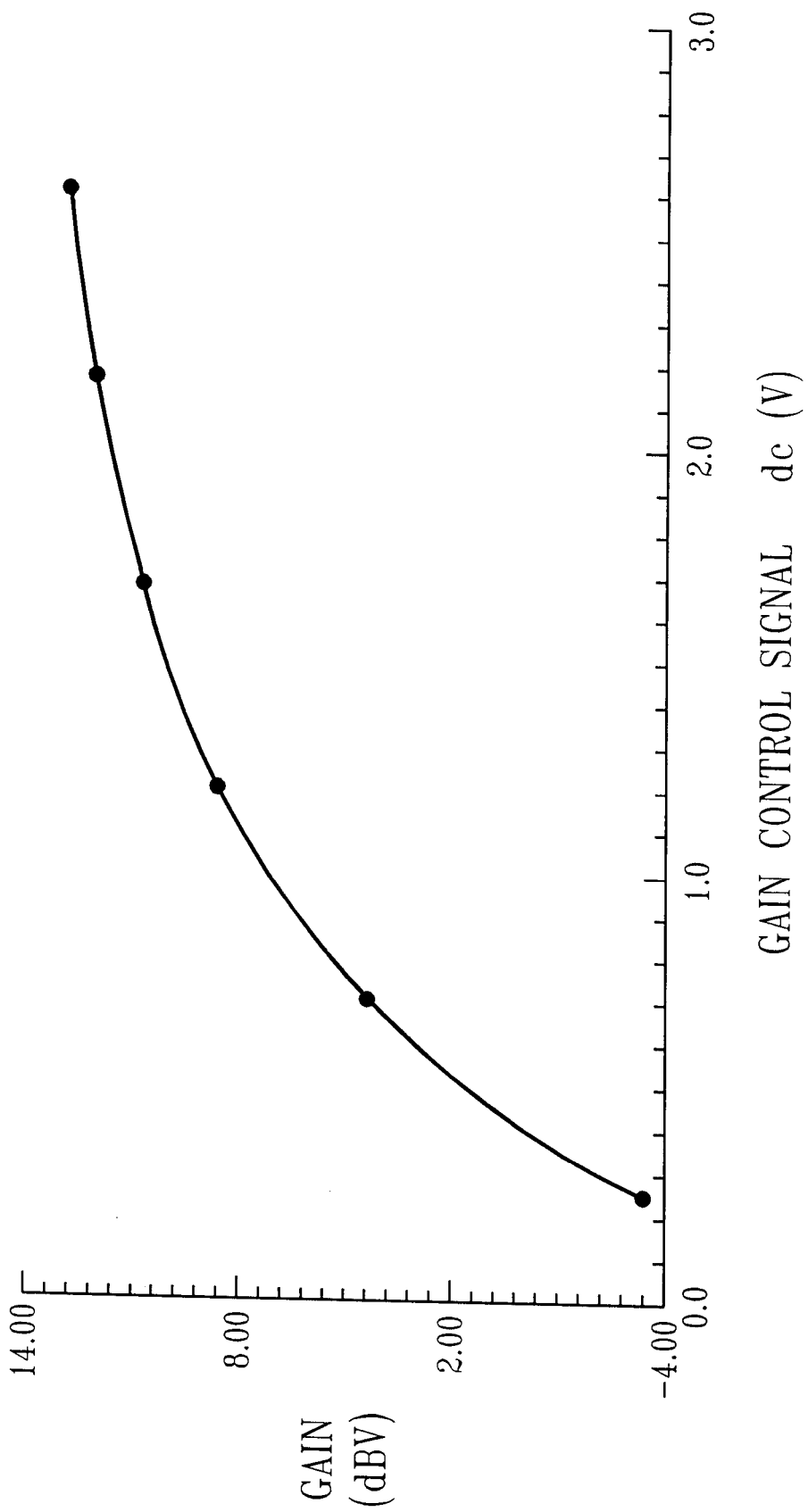
FIG. 2 illustrates the variable gain of the circuit of FIG. 1 in response to a gain control signal.

FIG. 2 illustrates the regulation of the differential amplifier gain in response to the gain control signal applied to terminal 22. The gain is the mathematical ratio of the differential output signal voltage, appearing on terminals 17, 18 and the differential input signal voltage on terminals 19, 20 applied to the bases of these transistors. For a 0.3 VDC gain control signal applied to terminal 22, the differential amplifier produces a gain of less than −3 dB (decibels in units of volts). A 2.5 VDC gain control signal produces a gain of more than 12 dB. When used as a power control amplifier for an RF transmitter, the amplifier produces a power output of 10 dBm (decibels relative to 1 mW in a 50 ohm system) for a gain of 12 dB at its 1 dB compression point.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A variable gain RF amplifier comprising:
   first and second bipolar input transistors having base terminals for receiving a differential input signal;
   first and second inductors which connect respective emitter terminals of said transistors to a common terminal;

a transformer coupled to the collectors of said first and second input transistors for producing an amplified signal from said input signal, and for applying an operating voltage to said transistors; and a variable resistor which has a resistance value determined by a gain control signal, comprising a series of field effect transistors connected between respective emitter terminals of said bipolar transistors, said field effect transistors having gate connections which receive said gain control signal.

2. The variable gain RF amplifier according to claim 1, further comprising:

a temperature compensation circuit that is electrically connected to said gain control circuit;

said temperature compensation circuit substantially compensating temperature induced variations of resistance, of said variable resistance by regulating said gain signal, whereby changes in the voltage potential across said variable resistor with respect to temperatures are substantially reduced.

3. The variable gain RF amplifier according to claim 1, further comprising:

a slope compensation circuit that supplies said gain signal to said gain control circuit.

4. The variable gain RF amplifier according to claim 2, further comprising:

a slope compensation circuit is serially connected to said gain control circuit and said temperature compensation circuit to generate a gain control signal having a predetermined amplitude/frequency function.

5. A variable gain RF amplifier according to claim 3, wherein:

said slope compensation circuit varies said gin control signal to produce a linear relationship between said differential amplifier gain and said input signal to said slope compensation circuit.

6. The variable gain control RF amplifier according to claim 1 further comprising a transistor for converting said gain control signal from a current signal to a voltage signal, and applies said voltage signal to said field effect transistor gate connections.

7. A variable gain RF amplifier according to claim 1, wherein:

said multiple transistors of said gain control circuit are field effect transistors (FETs) comprising a first, a second, and a third FET;

the drain of said first FET is electrically connected to the emitter of one of said differential amplifier transistors;

the source of said third FET is electrically connected to the emitter of the other differential amplifier transistor;

the source of said first FET is connected to the drain of said second FET and the source of said second FET is connected to the drain of said third FET;

a first capacitor couples the gate and drain terminals of said first FET and is selectively chosen to substantially provide an electrical short, between these terminals, for an applied analog signal within a range of operational frequencies;

a second capacitor couples the gate and source terminals of said third FET and is selectively chosen to substantially provide an electrical short, between these terminals, for an applied analog signal within a range of operational frequencies;

a first resistor electrically interconnects the gate terminals of said first and second FETs;

a second resistor electrically interconnects the gate terminals of said second and third FETs; and said gain signal is applied to the gate terminal of said second FET.

8. A variable gain RF amplifier according to claim 1, wherein the range of operational frequencies for said variable gain RF amplifier includes 2 GHz.

9. A variable gain RF amplifier according to claim 1, wherein the gain has a range of 15 dB.

10. A variable gain RF amplifier according to claim 1, wherein:

said variable gain amplifier substantially has a power output of +10 dBm and a 12 dB gain at its 1 dB compression point.

* * * * *